(12) United States Patent
Kobayashi et al.

(10) Patent No.: US 7,535,078 B2
(45) Date of Patent: May 19, 2009

(54) SEMICONDUCTOR DEVICE HAVING A FUSE AND METHOD OF FORMING THEREOF

(75) Inventors: Thomas S. Kobayashi, Austin, TX (US); Stephen G. Sheck, Marble Falls, TX (US); Scott K. Pozder, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 666 days.

(21) Appl. No.: 10/075,218

(22) Filed: Feb. 14, 2002

(65) Prior Publication Data

US 2003/0151060 A1 Aug. 14, 2003
US 2007/0267651 A9 Nov. 22, 2007

(51) Int. Cl.
*H01L 23/62* (2006.01)

(52) U.S. Cl. ............... 257/529; 257/E23.149; 438/281

(58) Field of Classification Search ............... 257/529, 257/207, 390, 777, 778, 110, 100, 779, 50, 257/209, 530, E23.149; 287/530; 438/108, 438/131, 132, 215, 218, 333, 467, 601, 281
See application file for complete search history.

(56) References Cited

U.S. PATENT DOCUMENTS

| | | | | |
|---|---|---|---|---|
| 4,628,590 A | * | 12/1986 | Udo et al. ............... | 438/6 |
| 5,353,498 A | * | 10/1994 | Fillion et al. ............ | 29/840 |
| 5,514,449 A | * | 5/1996 | Tingerthal et al. ....... | 428/195.1 |
| 5,652,459 A | | 7/1997 | Chen | |
| 5,731,624 A | | 3/1998 | Motsiff et al. | |
| 5,736,433 A | * | 4/1998 | Bryant et al. ........... | 438/130 |
| 5,795,819 A | | 8/1998 | Motsiff et al. | |
| 5,821,160 A | | 10/1998 | Rodriguez et al. | |
| 5,972,756 A | * | 10/1999 | Kono et al. ............. | 438/281 |
| 6,011,734 A | | 1/2000 | Pappert | |
| 6,021,078 A | | 2/2000 | Le et al. | |
| 6,033,939 A | | 3/2000 | Agarwala et al. | |
| 6,100,116 A | | 8/2000 | Lee et al. | |
| 6,159,754 A | * | 12/2000 | Li et al. ................. | 438/4 |
| 6,191,023 B1 | | 2/2001 | Chen | |
| 6,218,279 B1 | * | 4/2001 | Weber et al. ........... | 438/601 |
| 6,222,212 B1 | * | 4/2001 | Lee et al. .............. | 257/207 |
| 6,239,455 B1 | | 5/2001 | Becker et al. | |
| 6,295,721 B1 | | 10/2001 | Tsai | |

(Continued)

FOREIGN PATENT DOCUMENTS

JP 11355173 * 12/1999

OTHER PUBLICATIONS

Wolf et al., "Silicon Processing for the VLSI Era: Process Integration," vol. II, 1990, pp. 273-275.*

(Continued)

*Primary Examiner*—Douglas M Menz
*Assistant Examiner*—Steven J. Fulk
(74) *Attorney, Agent, or Firm*—Kim-Marie Vo; Susan C. Hill

(57) ABSTRACT

A fuse (43) is formed overlying a passivation layer (35) and under a packaging material (55, 70). In one embodiment, a fuse (43) is blown before the packaging material (55, 70) is formed. In some embodiments, the fuse (43) may be formed of metal (47), a metal nitride (42) or a combination thereof.

20 Claims, 4 Drawing Sheets

U.S. PATENT DOCUMENTS

| | | | |
|---|---|---|---|
| 6,297,541 | B1 | 10/2001 | Ema et al. |
| 6,300,233 | B1 | 10/2001 | Lee et al. |
| 6,335,229 | B1 | 1/2002 | Pricer et al. |
| 6,519,844 | B1 * | 2/2003 | Nagarajan et al. ............. 29/841 |
| 6,979,868 | B2 * | 12/2005 | Chen et al. .................. 257/356 |

OTHER PUBLICATIONS

T. Schiml et al., "A.0. 13μm CMOS Platform with Cu/Low-k Interconnects for System On Chip Applications", 2001 IEEE Symposium on VLSI Technology Digest of Technical Papers, published May 13, 2001, 2 pgs.

* cited by examiner

SEMICONDUCTOR DEVICE HAVING A FUSE AND METHOD OF FORMING THEREOF

RELATED APPLICATIONS

This application is related to U.S. patent application Ser. No. 09/285,666 filed Apr. 5, 1999, and entitled "Semiconductor Device and Method of Formation" and Ser. No. 10/051,262 filed Jan. 18, 2002, and entitled "Semiconductor Device and Method of Formation". Both are assigned to the current assignee hereof.

FIELD OF THE INVENTION

The field of the invention relates generally to semiconductor devices, and more specifically, to fuses.

BACKGROUND OF THE INVENTION

After forming circuitry on a semiconductor device, it is desirable to change the state of some circuitry to provide electrical chip identification, customization of function and to substitute a spare row or column for a defective element, such as a bit. Typically, creating an electrically measured connection, termed a fuse, and attaching it to circuitry that will sense the change in state of the electrically measured connection accomplishes this. Fuses can be formed from metal lines, which are surrounded by an interlayer dielectric (ILD) and are covered by a passivation layer. When it is desired to change the state of the electrically measured connection, portions of the fuse are removed in order to create an open. Typically, a portion of the fuse is physically severed (blown) by absorbing energy from a laser, superheating, breaking the passivation layer and boiling, vaporizing or exploding. Hence, when the fuse is blown, an opening is left in the passivation layer leaving the remnant fuse and the underlying and surrounding ILD exposed.

Traditionally, aluminum is used for the metal lines of the semiconductor device. To increase the speed at which the semiconductor device operates, aluminum metal lines and interconnects are being replaced with copper. However, copper does not form a self-passivation layer like aluminum and therefore does not protect any underlying layers from corrosion as the aluminum does by the presence of the self-passivation layer. To keep the absence of the self-passivation layer from affecting the reliability of the semiconductor device, the copper fuse terminates on a refractory metal plug, which prevents corrosion resulting from the exposure to the environment of a blown fuse. The presence of the refractory metal plug prevents corrosion from spreading to other parts of the semiconductor device. In some cases, the blown copper fuse can cause delamination of the ILD and spread to adjacent parts of the semiconductor device, such as another fuse. To prevent delamination and corrosion spreading, a wet acid treatment can be used to remove the blown copper fuse, thereby exposing the refractory metal plug, which prevents corrosion. However the wet acid treatment is an additional process step that is not cost effective when compared to the failure rate of the semiconductor device due to corrosion of the blown copper fuses. Therefore, a need exits for a process for forming fuses for semiconductor devices with copper metal lines that does not add a costly process step and prevents corrosion of the fuses.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

A semiconductor device includes a semiconductor substrate with a first circuit and a second circuit formed therein. The first and second circuits have a first contact area and a second contact area, respectively. A fuse, which can be selectively open-circuited, is formed over a passivation layer, which is formed over portions of the semiconductor substrate, and under packaging materials, such as an underfill and mold compound. The fuse has a third contact area which is electrically coupled to the first contact area of the first circuit, and a fourth contact area which is electrically coupled to the second contact area of the second circuit so that if the fuse is open-circuited, the first contact area of the first circuit and the second contact area of the second circuit are no longer electrically connected. The invention is defined by the claims and better understood by turning to the figures.

Figure 1:
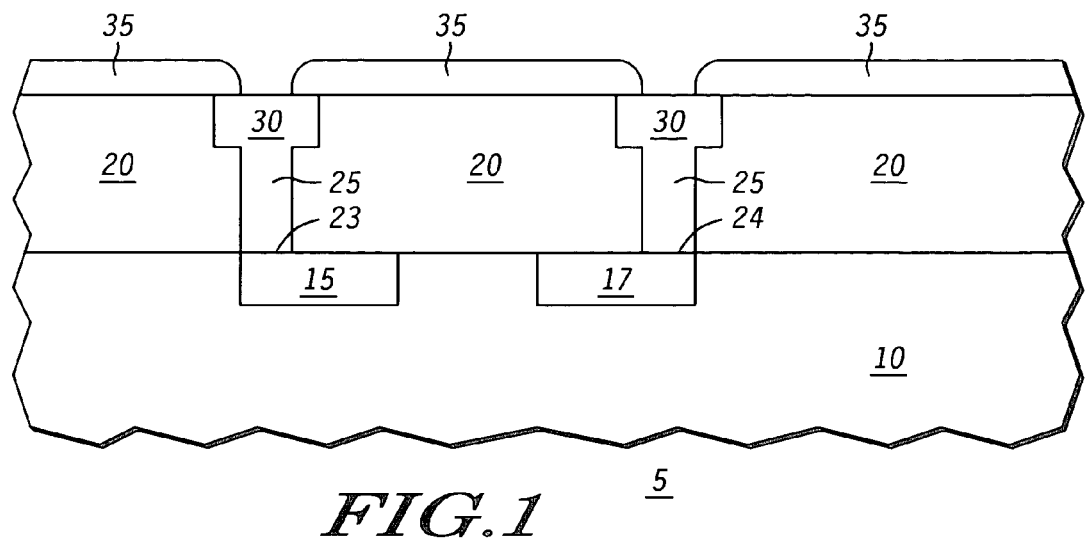
FIG. 1 illustrates a cross-section of a portion of a semiconductor device with interconnects formed under the passivation layer in accordance with an embodiment of the present invention.

FIG. 1 illustrates a cross-sectional illustration of a semiconductor device 5 including a semiconductor substrate 10, conductive regions 30, interconnects 25 separated by an interlayer dielectric (ILD) layer 20, and a passivation layer 35 overlying portions of the ILD layer 20. The semiconductor substrate 10 includes a semiconductor layer and circuitry, such as a first circuit 15 and a second circuit 17 formed within the semiconductor layer and can be silicon, silicon germanium, gallium arsenide, the like, and combinations of the above. The circuitry 15 and 17 can include transistors, resistors, inductors, capacitors, the like, and combinations of the above. The first circuit 15 and the second circuit 17 should not be electrically coupled to each other within the semiconductor substrate 10, but may be electrically coupled to circuitry not shown.

The conductive regions 30 are the top most metal layer (last metal layer or last metal line) in the semiconductor device and can be any conductive material, such as aluminum, copper, tantalum, tungsten, tantalum nitride, tungsten nitride, titanium, titanium nitride, the like and combinations of the above, and is preferably copper formed over a tantalum layer. The conductive regions are coupled to the first circuit 15 and the second circuit 17 by the interconnects 25 at a first contact area 23 and the second contact area 24, respectively. The interconnects 25, which can be any material described for the conductive regions 30, are formed in one embodiment by depositing the ILD layer 20, etching openings in the ILD layer 20, forming a conductive material within the openings, and planarizing the conductive material, as known to one skilled in the art. The interconnects 25 can be trenches or vias.

The ILD layer 20 can be any insulating material, such as silicon dioxide formed using tetraethylorthosilane (TEOS), fluorinated silicon dioxide formed using F-TEOS, a low dielectric constant (low-k) material and can be formed by chemical vapor deposition (CVD), physical vapor deposition (PVD), the like and combinations of the above.

The passivation layer 35 is formed over the ILD layer 20 and the conductive regions 30 to protect the underlying layers from physical handling of the semiconductor device 5, the environment (especially humidity), and patterned using conventional means to expose portions of the conductive regions 30. In one embodiment, the passivation layer 35 is a stack of about 0.05 microns of silicon nitride under about 0.45 microns of silicon oxynitride as deposited; any other suitable material, such as another nitride material, and any other dimensions can be used.

Figure 2:
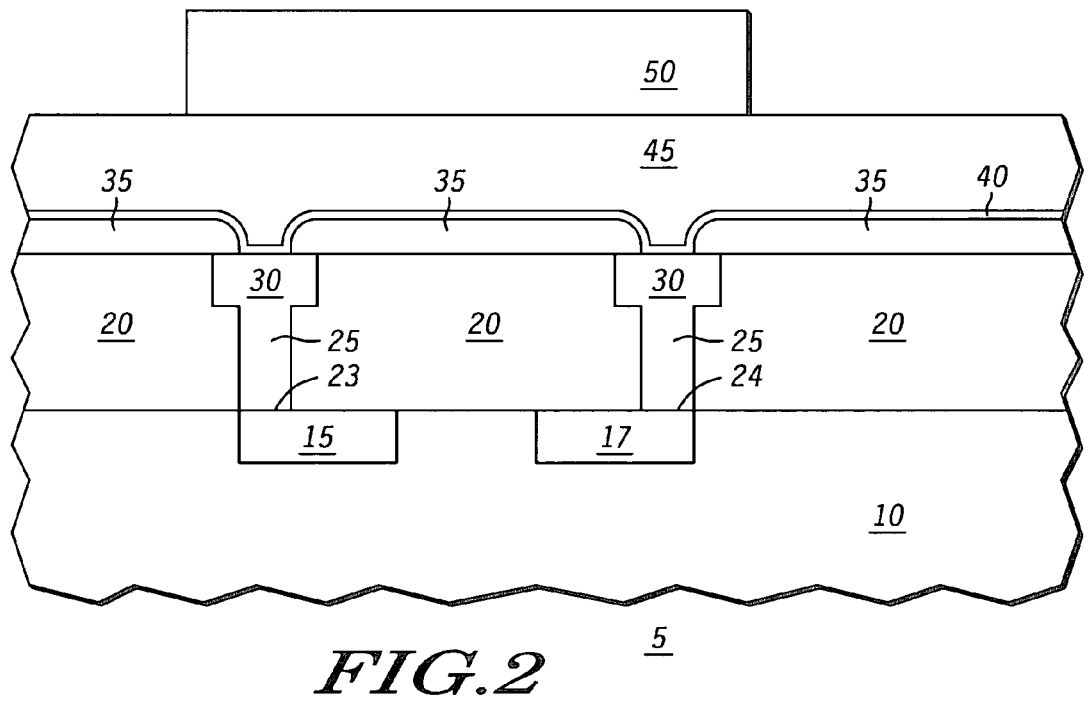
FIG. 2 illustrates FIG. 1 after forming a metal layer over the passivation layer.

After patterning the passivation layer 35, an optional barrier layer 40 and metal layer 45 are formed over the passivation layer 35 by CVD, PVD, electroplating, electroless plating, atomic layer deposition (ALD), the like and combinations of the above, and masked using a photoresist layer 50, as shown in FIG. 2. The optional barrier layer 40 can be any conductive material, such as refractory metals (tantalum, titanium, tungsten and the like), metal nitrides, and refractory metal nitrides (titanium nitride, tantalum nitride, tungsten nitride and the like), and is approximately 0.004 microns to 0.055 microns or more preferably 0.05 microns in thickness. In an embodiment where the semiconductor device 5 will be assembled in an electroplated bump process, the thickness of the optional barrier layer 40 may be approximately 1 micron, but is preferably less than approximately 1 micron. The metal layer 45, formed over the optional barrier layer 40, can be any self-passivating conductive material and preferably is aluminum. In one embodiment, the metal layer 45 is less than approximately 1 micron in thickness.

Figure 3:
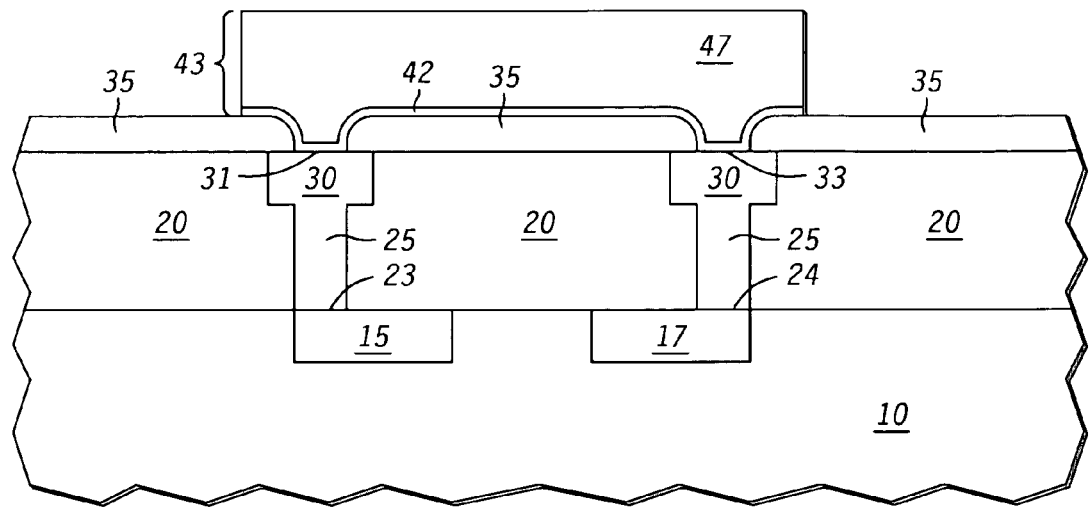
FIG. 3 illustrates FIG. 2 after removing a portion of the metal layer to form a fuse.

As shown in FIG. 3, the photoresist layer 50 is patterned using conventional photolithography and etch conditions so that portions of the metal layer 45 and the optional barrier layer 40, if present, that are not overlying or between the two conductive regions 30 are removed. A chemistry including chlorine can be used. In one embodiment, approximately 0.1 microns of the passivation layer 35 is also removed due to the etch chemistry chosen.

The resulting structure is a fuse 43, including the patterned metal layer 47 and the patterned optional barrier layer 42, formed over the conductive regions 30, which have a first contact area 31 coupled to the fuse 43 and a second contact area 33 coupled to the fuse 43. In one embodiment, the fuse is coupled to the first and second circuits 15 and 17 by the conductive regions 30 and the interconnects 25 via contact areas 23 and 24. The first circuit 15 and the second circuit 17 are electrically coupled to each other only by way of the fuse 43. Therefore, the first circuit 15 and the second circuit 17 are at the same electrical potential after forming the fuse 43. In one embodiment, the fuse is electrically connected to only the first and second circuits and is not electrically connected to anything external to the circuitry.

It is desirable to have permanent switches activated in order to allow activation and deactivation of circuitry, such as redundant memory columns or rows, to mark the semiconductor device 5 with a unique identification code, to allow one time programming of circuitry, or the like. The switch can be activated or toggled once by physically severing or blowing the fuse 43 as shown in FIG. 4.

In one embodiment to blow the fuse, a YLF (yttrium lithium fluoride) laser is pulsed with approximately 4 to 13 nanosecond pulse widths and directed at the fuse 43, resulting in a physical opening formed in the fuse and exposing the passivation layer 35. Any other suitable laser or energy source can be used. In other words, the fuse 43 is severed into two distinct portions. The power and spot size of the laser can be adjusted depending on the dimensions of the fuse 43, such as thickness and width. In one embodiment, a spot size of 4.5 μm and an energy of 1.20 μJ is used for a fuse 43 with a thickness of 1.2 μm and a width of 1.2 μm. Once the fuse 43 is blown, an electrical open (open circuit) is formed and the first circuit 15 and the second circuit 17 are not electrically connected and, in one embodiment, are at different electrical potentials. Testing to determine if the first circuit 15 and the second circuit 17 have changed electrical state may be performed. For example, a simple continuity test measuring the ability to pass current from one node to another may be performed.

Figure 4:
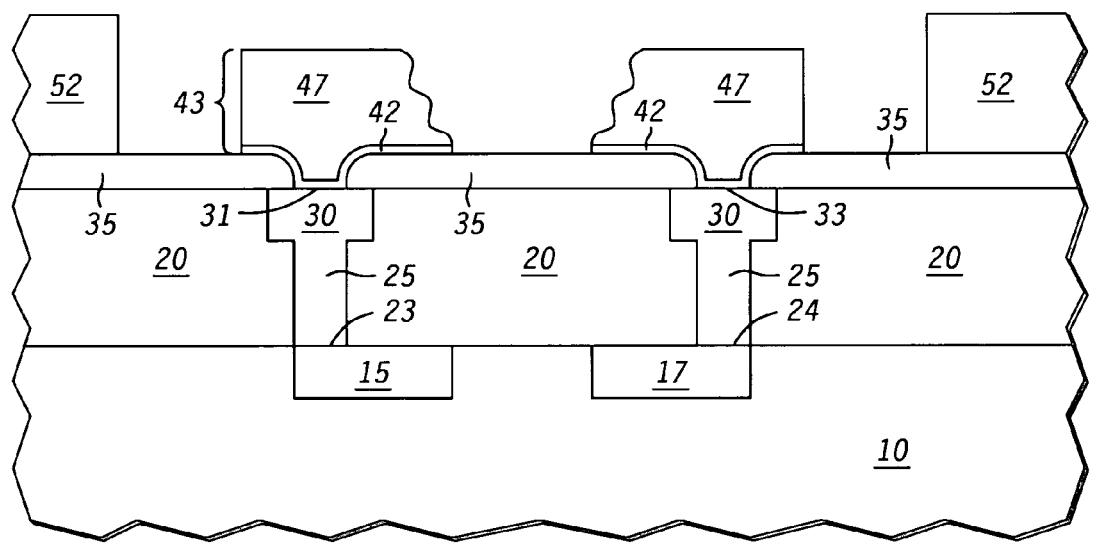
FIG. 4 illustrates FIG. 3 after physically severing the fuse.

The semiconductor device 5 as shown in FIG. 3 or 4 is subsequently packaged after forming and blowing the fuse 43, if necessary or desired. The semiconductor device 5 as shown in FIG. 3 or 4 can be packaged, in a wirebonded package, such as quad-flat package (QFP), and a ball grid array (BGA), a flip-chip package, a stacked package, a multichip module (MCM) package, combinations of the above, or any other package.

Figure 5:
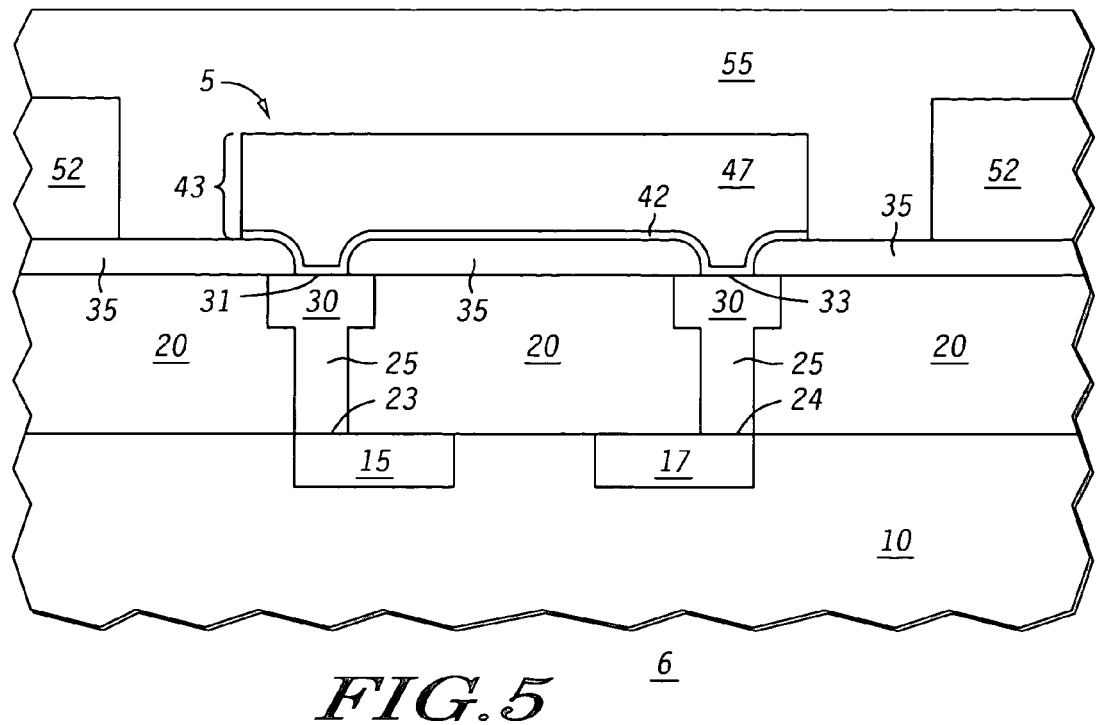
FIG. 5 illustrates the structure of FIG. 3 or 4 in a package having a mold encapsulant in accordance with a first embodiment.

As shown in FIG. 5, the semiconductor device 5 can be assembled in a package 6 having a mold encapsulant 55, such as a wirebonded package. A polyimide layer 52 is formed adjacent to and preferably not in physical contact with the fuse 43. In one embodiment, the polyimide layer 52 covers the ends of the fuse 43 over the first contact area 31 and the second contact area 33 but does not cover the portion of the patterned optional barrier layer 42 between the first contact area 31 and the second contact area 33, which is where the laser will be targeted when blowing the fuse 43. In one embodiment, the polyimide layer 52 is three times as thick as the patterned metal layer 47. From a top view the area of the semiconductor substrate 10 where the fuses 43 are present is not covered by the polyimide layer 52. The polyimide layer 52 is used as a protective layer during the packaging process. (The area of the substrate where the electrical connections, such as a wirebond, are made is not showed in FIG. 5, because it is well known by a skilled artisan.)

A mold compound 55, a packaging material, is formed over the patterned metal layer 47 and the polyimide layer 52. In one embodiment, the mold compound 55 is formed by flowing a viscous (at the temperature the process is being performed, which is usually room temperature) encapsulant material over the semiconductor device. The encapsulant material can also be injected or formed using a transfer mold process, which involves clamping a package cavity over the semiconductor device and flowing the encapsulant material. In one embodiment, to harden the viscous encapsulant material the semiconductor device is heated after the viscous encapsulant material is flown to decrease the viscosity of the encapsulant material so that the mold encapsulant 55 is not viscous at room temperature after being flowed. Generally, the mold encapsulant 55 is not formed by photolithography and etching. As shown in FIG. 5, the patterned metal layer 47 is in direct contact with the mold compound 55, in one embodiment.

In packages that do not have a mold encapsulant, the fuse 43 will be in contact with an underfill material, another packaging material, in place of the mold compound 55. For example, the semiconductor device of FIGS. 3 and 4 can be used in a flip chip BGA package. However, if the semiconductor device 5 is used in an electroplated bump flip-chip package, the fuse structure of both blown and unblown fuse structures may be modified during processing.

Figure 6:
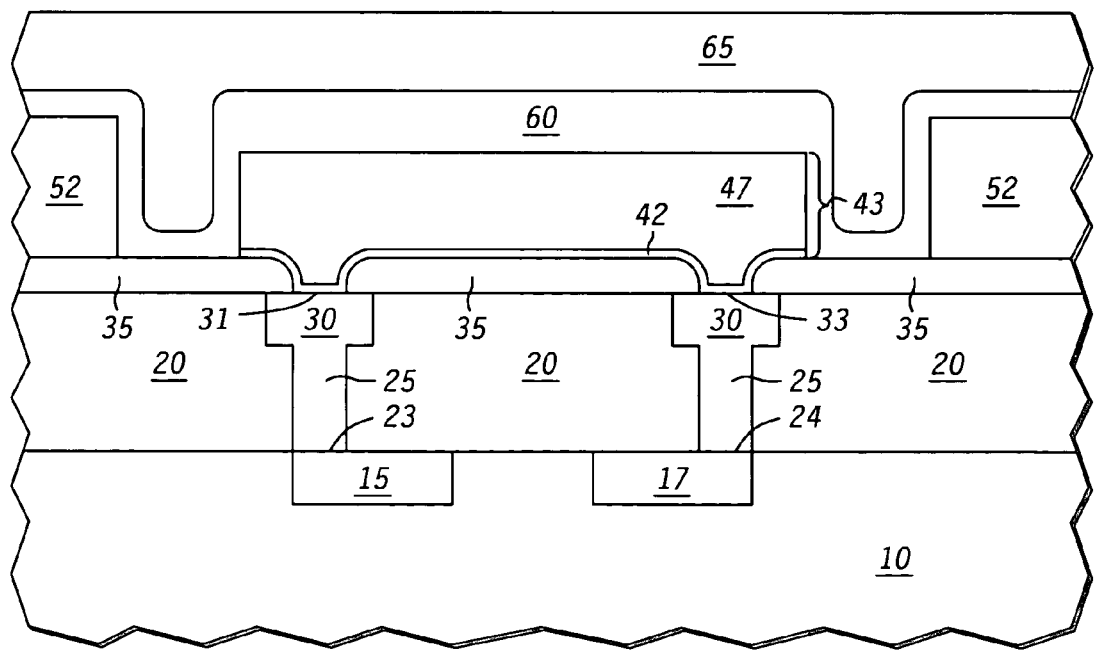
FIG. 6 illustrates the structure of FIG. 3 or 4 after forming a conductive seed layer in a flip-chip packaging process in accordance with a second embodiment.

As shown in FIG. 6, to form an electroplated bump flip-chip package 7, a conductive seed layer 60 is deposited over the patterned metal layer 47 and the polyimide layer 52 using CVD, PVD, ALD, combinations of the above, and the like. In one embodiment, the polyimide layer 52 is not formed and the conductive seed layer 60 is deposited on the passivation layer 35. A photoresist layer 65 is formed over the patterned metal layer 47 in order to form a bump in an area of the semiconductor substrate 10 that is not shown.

Figure 7:
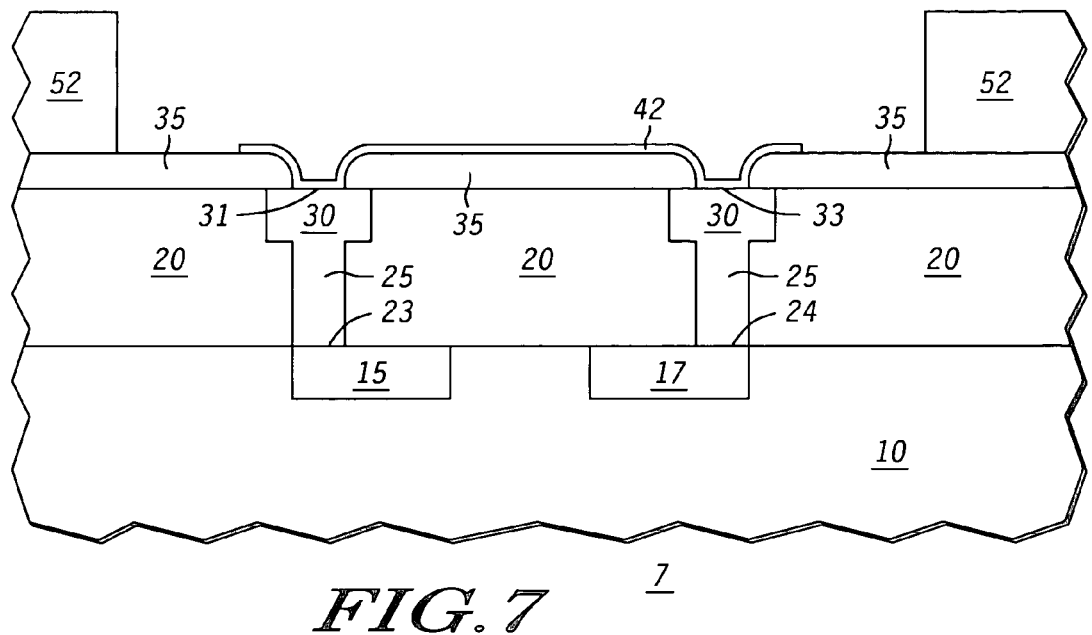
FIG. 7 illustrates the structure of FIG. 6 after removing the conductive seed layer and at least a portion of the patterned metal layer.
Figure 8:
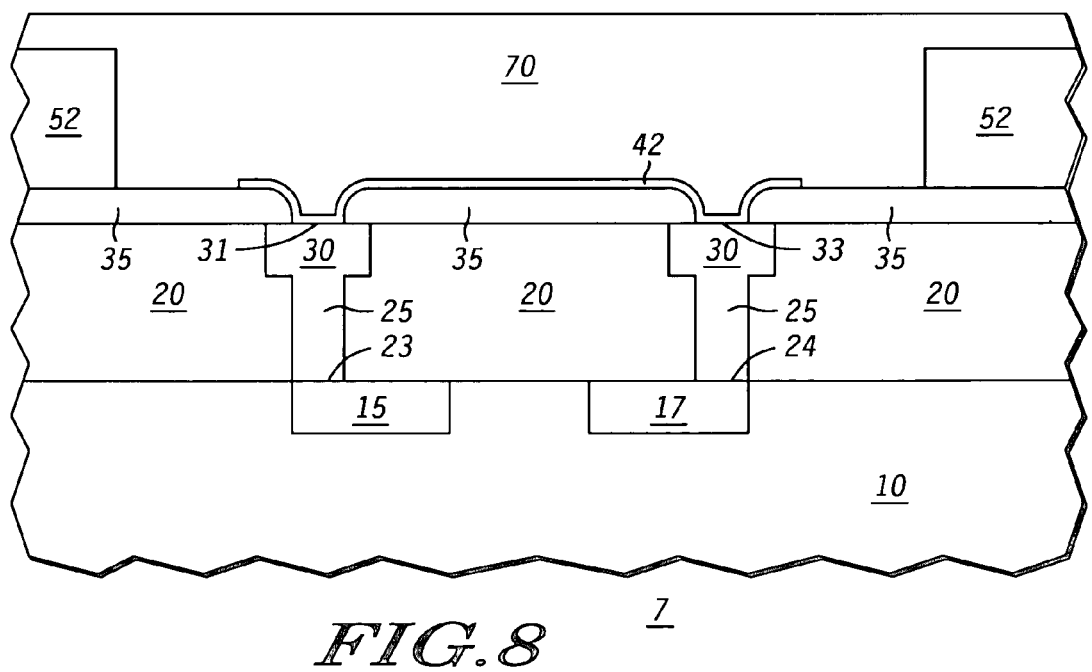
FIG. 8 illustrates the structure of FIG. 7 in an underfilled package.

After forming the bump, the photoresist layer 65 and the conductive seed layer 60 are removed as shown in FIG. 7. In one embodiment, while etching the conductive seed layer 60 at least portions of the patterned metal layer 47 are removed because the conductive seed layer 60 is not etched selective to the patterned metal layer 47. In this embodiment, the fuse is the patterned barrier layer 42, and, thus, is not optional. Although not shown in FIG. 7, some of the patterned metal layer 47 may remain over the patterned barrier layer 42 and thus the fuse 43 may include the remaining patterned metal layer 47 and the patterned barrier layer 42. Alternatively, some of the patterned barrier layer 42 may be removed. The thickness of the fuse 43 depends on the presence of the optional barrier layer 42 as well as the method of forming the fuse 43. In one embodiment, the fuse 43 is at least approximately 0.01 microns. For example, the fuse 43 can be approximately 0.02 microns of tantalum. In an embodiment where ALD is used for forming the fuse 43, the fuse 43 may be at least approximately 0.0025 microns. Therefore, in one embodiment, the process for removing the conductive seed layer 60 is substantially selective to the patterned barrier layer 42.

After removing the conductive seed layer 60, and assembling the semiconductor device 5 into a flip chip package, an underfill 70 is formed over the fuse 43, which includes the patterned barrier layer 42 and may include portions of the patterned metal layer 47. The underfill 70 can be formed by dispensing the underfill 70 on one side of the semiconductor device 5 and is drawn using capillary action underneath the semiconductor device 5. Generally, the underfill 70 is not formed by photolithography and etching.

Although as shown in FIGS. 1-8, the entire fuse 43 is formed over the passivation layer 35, the entire fuse 43 or portions of the fuse 43 can be formed within a recess area of the passivation layer 35. For example, the passivation layer 35 in FIG. 1 can be etched, after patterned, using either one or multiple etch steps in order to form the recess area of the passivation layer 35. In one embodiment the passivation layer 35 is not completely removed in the recess areas. In other words, a portion of the passivation layer's 35 thickness can be reduced. The optional barrier layer 40 and the metal layer 45 can be formed over portions of the passivation layer 35 and within the recess area of the passivation layer 35. Processing can continue as described above.

Forming the fuse over the passivation layer and under the packaging material is advantageous because lower power can be used to blow the fuses since the fuse is not covered by the passivation layer prior to blowing. Therefore, the laser no longer needs to blow through the passivation layer. Additionally, this structure allows for the ability to use a low-k dielectric layer, such as a silicon dioxide layer formed using F-TEOS, as the ILD layer because the ILD layer will not be exposed to the environment after a fuse is formed. Low-k dielectric layers are prone to absorb water molecules when exposed to the environment. The water absorption undesirably results in an increased dielectric constant of the low-k dielectric layer and in the embodiment where silicon dioxide is formed using F-TEOS, a chemical breakdown of the silicon dioxide layer, which adversely affect the performance of the semiconductor device. In the embodiment where copper is used for the metal interconnects and lines and the fuse includes aluminum, the benefits of copper interconnects and lines is gained without the fuse, if blown, oxidizing and the environment substantially altering the material properties of the fuse. In addition, the fuse thickness for all generations and all parts can be identical, allowing for the parameters of the laser used to blow fuses to not be adjusted. When the fuses are formed using the last metal layer, the thickness of the fuse for different generations of parts can vary because the last metal layer's thickness often varies. Thus to blow the fuses, engineering and process time is needed to adjust the parameters of the laser. Therefore, development time for the fuse blowing process can be reduced or eliminated by placing the fuses over the passivation layer.

In the foregoing specification, the invention has been described with reference to specific embodiments. However, one of ordinary skill in the art appreciates that various modifications and changes can be made without departing from the scope of the present invention as set forth in the claims below. For example, the formation of the interconnects 25 and the conductive regions 30 can be formed as part of a dual inlaid or single inlaid integration scheme, although both were not described herein. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A semiconductor device, comprising:
   a substrate having circuitry formed therein;
   a passivation layer formed overlying at least a portion of the substrate;
   a fuse, which may be selectively open-circuited, formed overlying the passivation layer; and a packaging material formed in contact with an entire surface the fuse, wherein the packaging material is selected from the group consisting of a mold compound and an underfill.

2. A semiconductor device as in claim 1, wherein a recessed area is formed in the passivation layer and wherein at least a portion of the fuse is formed in the recessed area.

3. A semiconductor device as in claim 1, wherein the fuse comprises a metal.

4. A semiconductor device as in claim 3, wherein the fuse comprises aluminum.

5. A semiconductor device as in claim 1, wherein the fuse comprises a metal nitride.

6. A semiconductor device as in claim 1, wherein the fuse comprises a metal and a metal nitride.

7. A semiconductor device as in claim 1, wherein the fuse comprises a metal having a thickness less than approximately 1 micron.

8. A semiconductor device as in claim 1, wherein the fuse is electrically connected to only the circuitry, and is not electrically connected to anything external to the circuitry.

9. The semiconductor device as in claim 1, wherein the circuitry comprises a first circuit and a second circuit, the semiconductor device further comprising:
 a first interconnect for electrically connecting the first circuit to a first portion of the fuse; and
 a second interconnect for electrically connecting the second circuit to a second portion of the fuse,
 wherein the first circuit and the second circuit are no longer electrically connected if the fuse is open-circuited.

10. The semiconductor device as in claim 1, wherein the fuse is in contact with the passivation layer.

11. A semiconductor device, comprising:
 a substrate having a first circuit formed therein, a second circuit formed therein, and a fuse, wherein:
  the first circuit has a first contact area,
  the second circuit has a second contact area; and
  the fuse, which may be selectively open-circuited, is formed overlying the passivation layer, the fuse having a third contact area which is electrically coupled to the first contact area of the first circuit, and the fuse having a fourth contact area which is electrically coupled to the second contact area of the second circuit, wherein the first contact area of the first circuit and the second contact area of the second circuit are no longer electrically connected if the fuse is open-circuited;
 a first interconnect for electrically connecting the first contact area to a first portion of the fuse; and
 a second interconnect for electrically connecting the second contact area to a second portion of the fuse,
 a passivation layer formed overlying at least a portion of the substrate, wherein the fuse is formed overlying the passivation layer; and
 a packaging material formed in contact with an entire length of the fuse, wherein the packaging material is selected from the group consisting of a mold compound and an underfill.

12. A semiconductor device as in claim 11, wherein a recessed area is formed in the passivation layer and wherein at least a portion of the fuse is formed in the recessed area.

13. A semiconductor device as in claim 11, wherein the fuse comprises a metal.

14. A semiconductor device as in claim 13, wherein the fuse comprises aluminum.

15. A semiconductor device as in claim 11, wherein the fuse comprises a metal nitride.

16. A semiconductor device as in claim 11, wherein the fuse comprises a metal and a metal nitride.

17. A semiconductor device as in claim 11, wherein the first contact area of the first circuit and the second contact area of the second circuit are electrically connected only by way of the fuse.

18. A method for forming a semiconductor device having a fuse, comprising:
 providing a substrate;
 forming a passivation layer overlying at least a portion of the substrate;
 forming the fuse overlying the passivation layer;
 forming circuitry within the substrate, and
 forming a packaging material in contact with an entire surface the fuse, wherein the packaging material is selected from the group consisting of a mold compound and an underfill.

19. A method of claim 18, further comprising:
 blowing the fuse before forming a packaging material.

20. A method of claim 18, wherein forming the circuitry comprises:
 forming a first circuit and forming a second circuit;
 forming a first interconnect for electrically connecting the first circuit to a first portion of the fuse; and
 forming a second interconnect for electrically connecting the second circuit to a second portion of the fuse, wherein the first circuit and the second circuit are no longer electrically connected if the fuse is open-circuited.

* * * * *